United States Patent
Imamura

(10) Patent No.: US 11,070,187 B2
(45) Date of Patent: Jul. 20, 2021

(54) MULTILAYER BAND PASS FILTER

(71) Applicant: Murata Manufacturing Co., Ltd., Nagaokakyo (JP)

(72) Inventor: Mitsutoshi Imamura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/847,706

(22) Filed: Apr. 14, 2020

(65) Prior Publication Data

US 2020/0243254 A1 Jul. 30, 2020

Related U.S. Application Data

(63) Continuation of application No. PCT/JP2018/038117, filed on Oct. 12, 2018.

(30) Foreign Application Priority Data

Oct. 30, 2017 (JP) .............................. JP2017-209280

(51) Int. Cl.
*H03H 7/09* (2006.01)
*H03H 7/01* (2006.01)
(Continued)

(52) U.S. Cl.
CPC ....... *H03H 7/0115* (2013.01); *H01F 17/0013* (2013.01); *H01F 27/2804* (2013.01); *H01F 27/29* (2013.01); *H01F 27/323* (2013.01); *H01F 27/40* (2013.01); *H03H 7/0161* (2013.01); *H03H 7/09* (2013.01); *H03H 7/1708* (2013.01); *H03H 7/1775* (2013.01);
(Continued)

(58) Field of Classification Search
CPC .......... H03H 7/0115; H03H 2001/0085; H01F 27/2804
USPC .................................................. 333/175, 185
See application file for complete search history.

(56) References Cited

U.S. PATENT DOCUMENTS 9,306,529 B2 * 4/2016 Imamura ............. H01P 1/20345
2002/0057139 A1 * 5/2002 Matsumura .......... H03H 7/1775
333/185
(Continued)

FOREIGN PATENT DOCUMENTS

EP     2 009 787 A1    12/2008
JP     06-6104 A    1/1994
(Continued)

OTHER PUBLICATIONS

Official Communication issued in International Patent Application No. PCT/JP2018/038117, dated Dec. 25, 2018.

*Primary Examiner* — Rakesh B Patel
(74) *Attorney, Agent, or Firm* — Keating & Bennett, LLP

(57) ABSTRACT

A multilayer band pass filter includes first and second LC parallel resonators. The first and second LC parallel resonators include a first inductor and a second inductor, respectively. The first inductor includes a first line conductive pattern, a first via conductive pattern, and a second via conductive pattern. The first line conductive pattern extends in the X-axis direction on a first dielectric layer. The first via conductive pattern and second via conductive pattern extend from the first line conductive pattern toward a second dielectric layer. The second inductor includes a third via conductive pattern extending in the Z-axis direction.

15 Claims, 11 Drawing Sheets

(51) Int. Cl.
*H01F 27/28* (2006.01)
*H01F 27/29* (2006.01)
*H01F 27/32* (2006.01)
*H01F 27/40* (2006.01)
*H01F 17/00* (2006.01)
*H03H 1/00* (2006.01)

(52) U.S. Cl.
CPC ............ *H01F 2017/0026* (2013.01); *H01F 2027/2809* (2013.01); *H03H 2001/0085* (2013.01)

(56) References Cited

U.S. PATENT DOCUMENTS

| | | |
|---|---|---|
| 2013/0154769 A1 | 6/2013 | Masuda |
| 2013/0241672 A1 | 9/2013 | Tamaru et al. |
| 2018/0013395 A1 | 1/2018 | Asada |

FOREIGN PATENT DOCUMENTS

| | | |
|---|---|---|
| JP | 2008-017242 A | 1/2008 |
| JP | 2013-128232 A | 6/2013 |
| WO | 2007/119356 A1 | 10/2007 |
| WO | 2012/066873 A1 | 5/2012 |
| WO | 2014/156719 A1 | 10/2014 |
| WO | 2016/152211 A1 | 9/2016 |

\* cited by examiner

MULTILAYER BAND PASS FILTER

CROSS REFERENCE TO RELATED APPLICATIONS

This application claims the benefit of priority to Japanese Patent Application No. 2017-209280 filed on Oct. 30, 2017 and is a Continuation Application of PCT Application No. PCT/JP2018/038117 filed on Oct. 12, 2018. The entire contents of each application are hereby incorporated herein by reference.

BACKGROUND OF THE INVENTION

1. Field of the Invention

The present invention relates to a multilayer band pass filter.

2. Description of the Related Art

There are known multilayer band pass filters each formed as a multilayer body in which a plurality of dielectric layers are laminated in a lamination direction. For example, International Publication No. 2007/119356 discloses a multilayer band pass filter in which neighboring LC parallel resonators are coupled to each other.

Each of the LC parallel resonators included in the multilayer band pass filter disclosed in International Publication No. 2007/119356 includes a loop-shaped inductor (loop via inductor) made up of a line electrode disposed on a dielectric layer and two via electrodes extending from opposite end portions of the line electrode toward a bottom surface of a multilayer body (surface of the multilayer body to be mounted on a substrate).

As the size of an air-core portion surrounded by the line electrode and two via electrodes increases, the inductance of the loop via inductor increases. To efficiently utilize the limited design space, typically the line electrode in the loop via inductor may be arranged in a position near an upper surface of the multilayer body (surface of the multilayer body opposed to the bottom surface), and the via electrodes in the loop via inductor may be arranged in positions near a side surface (surface parallel with the lamination direction).

If a conductor is arranged on the upper surface or side surface of the multilayer body, unnecessary electromagnetic field coupling occurs between the loop via inductor and the conductor. Depending on the position where the multilayer band pass filter is mounted, a conductor may be expected to be close to the upper surface or side surface. In that case, unnecessary electromagnetic field coupling also occurs between the loop via inductor and the conductor. Such unnecessary electromagnetic field coupling, which is not expected in design, may cause the frequency characteristics of the multilayer band pass filter to deviate from desired frequency characteristics.

SUMMARY OF THE INVENTION

Preferred embodiments of the present invention significantly reduce or prevent deviation in frequency characteristics of a multilayer band pass filter from desired frequency characteristics.

A multilayer band pass filter according to a preferred embodiment of the present invention includes a multilayer body including a plurality of dielectric layers that are laminated in a lamination direction. The plurality of dielectric layers include first and second dielectric layers. The multilayer band pass filter includes first and second LC parallel resonators. The first and second LC parallel resonators include first and second inductors, respectively. The first inductor includes a first line conductive pattern and first and second via conductive patterns. The first line conductive pattern extends in a first direction on the first dielectric layer. The first and second via conductive patterns extend from the first line conductive pattern toward the second dielectric layer. The second inductor includes a third via conductive pattern extending in the lamination direction.

With multilayer band pass filters according to preferred embodiments the present invention, deviation in frequency characteristics from desired frequency characteristics are able to be significantly reduced or prevented by the first inductor including the first line conductive pattern, the first via conductive pattern, and the second via conductive pattern and the second inductor including the third via conductive pattern.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
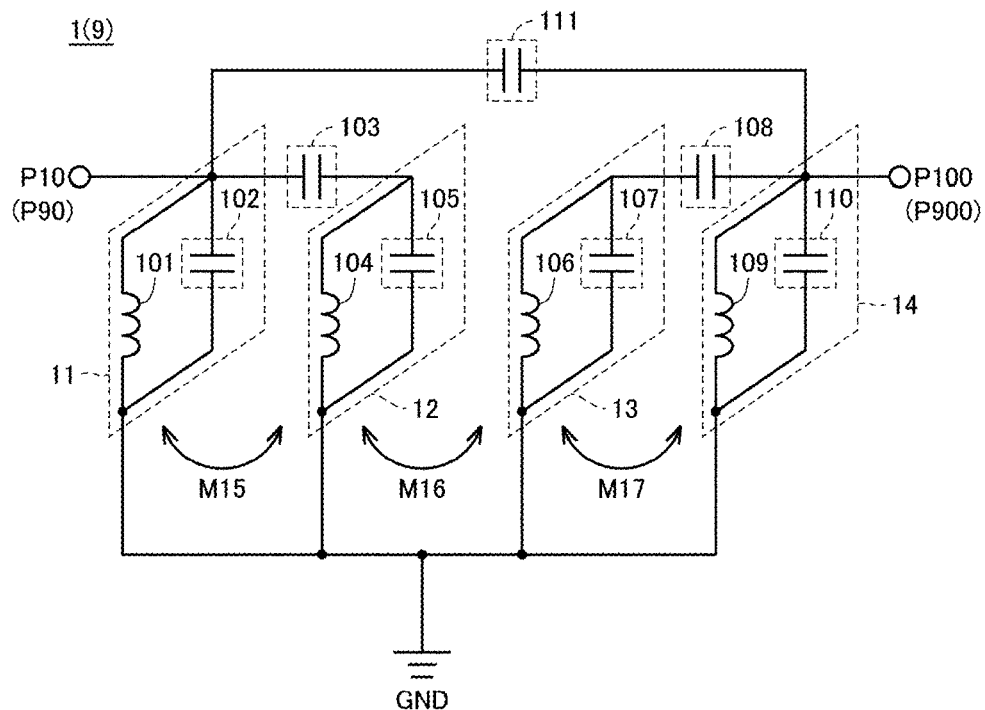
FIG. 1 is an equivalent circuit diagram of a multilayer band pass filter according to a first preferred embodiment of the present invention.

Preferred embodiments of the present invention are described in detail below with reference to the drawings. The same or corresponding sections in the drawings have the same reference numerals, and the description thereof is not repeated basically.

First Preferred Embodiment

FIG. 1 is an equivalent circuit diagram of a multilayer band pass filter 1 according to a first preferred embodiment of the present invention. FIG. 1 is also an equivalent circuit diagram of a multilayer band pass filter 9 according to a comparative example described below with respect to FIG. 4. As shown in FIG. 1, the multilayer band pass filter 1 includes terminals P10 and P100, LC parallel resonators 11 to 14, and capacitors 103, 108, and 111.

The LC parallel resonators 11 to 14 are provided in this order between the terminals P10 and P100. The LC parallel resonators 11 and 12 are next to each other. The LC parallel resonators 12 and 13 are next to each other. The LC parallel resonators 13 and 14 are next to each other.

Signals input through the terminal P10 are transmitted to the LC parallel resonators 11, 12, 13, and 14 in this order and then are output through the terminal P100. Signals input through the terminal P100 are transmitted to the LC parallel resonators 14, 13, 12, and 11 in this order and then are output through the terminal P10.

The LC parallel resonator 11 includes an inductor 101 and a capacitor 102. The LC parallel resonator 12 includes an inductor 104 and a capacitor 105. The LC parallel resonator 13 includes an inductor 106 and a capacitor 107. The LC parallel resonator 14 includes an inductor 109 and a capacitor 110.

A first terminal of the inductor 101 is electrically connected to the terminal P10. A second terminal of the inductor 101 is electrically connected to a ground point GND. The capacitor 103 is electrically connected between the first terminal of the inductor 101 and a first terminal of the inductor 104. A second terminal of the inductor 104 is electrically connected to the ground point GND. Magnetic coupling M15 occurs between the inductors 101 and 104.

The capacitor 108 is electrically connected between a first terminal of the inductor 106 and a first terminal of the inductor 109. The first terminal of the inductor 109 is electrically connected to the terminal P100. Each of a second terminal of the inductor 106 and a second terminal of the inductor 109 is electrically connected to the ground point GND. Magnetic coupling M16 occurs between the inductors 104 and 106. Magnetic coupling M17 occurs between the inductors 106 and 109. The capacitor 111 is electrically connected between the first terminal of the inductor 101 and the first terminal of the inductor 109.

Figure 2:
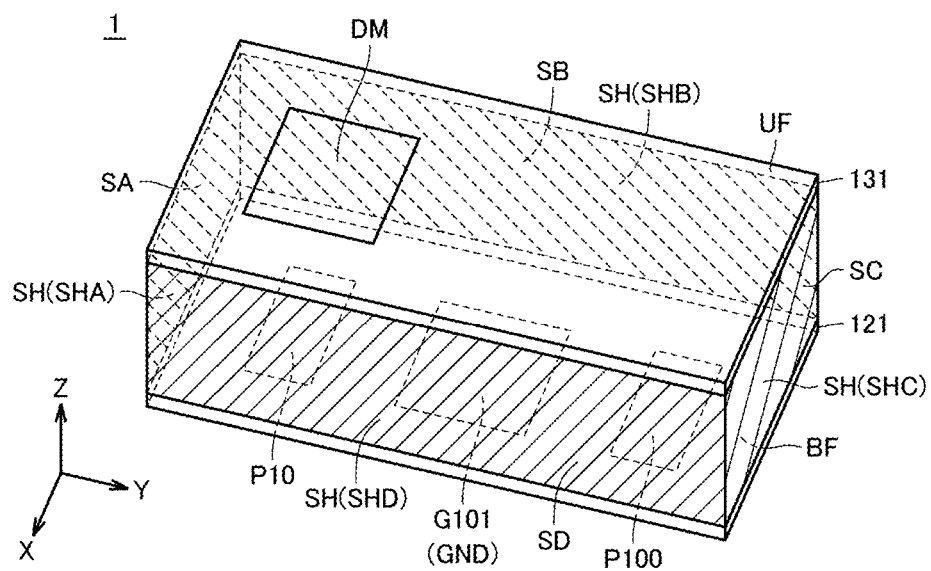
FIG. 2 is an external perspective view of the multilayer band pass filter in FIG. 1.

FIG. 2 is an external perspective view of the multilayer band pass filter 1 in FIG. 1. The multilayer band pass filter 1 is a multilayer body in which a plurality of dielectric layers 121 to 131 are laminated in a Z-axis direction (lamination direction). For coordinate axes, the X axis and Y axis are orthogonal or substantially orthogonal to each other, and the Z axis is orthogonal or substantially orthogonal to the X axis and Y axis. The same applies to the coordinate axes shown in FIGS. 2 to 5, 7, 8, 10, 12, and 14.

As shown in FIG. 2, one example shape of the multilayer band pass filter 1 may be a rectangular parallelepiped or a substantially rectangular parallelepiped. The surfaces of the outermost layers of the multilayer band pass filter 1 perpendicular or substantially perpendicular to the lamination direction are an upper surface UF and a bottom surface BF. Of the surfaces parallel or substantially parallel with the lamination direction, the surfaces parallel or substantially parallel with the ZX plane are side surfaces SA and SC. Of the surfaces parallel or substantially parallel with the lamination direction, the surfaces parallel or substantially parallel with the YZ plane are side surfaces SB and SD.

An orientation identification pattern DM is located on the upper surface UF. The terminals P10 and P100 and a ground terminal G101 are located on the bottom surface BF. The ground terminal G101 defines the ground point GND. Examples of the terminals P10 and P100 and the ground terminal G101 may be land grid array (LGA) terminals in which planar electrodes are regularly positioned on the bottom surface BF. The bottom surface BF is electrically connected to a substrate (not shown).

A shield electrode SH is located on each of the side surfaces SA to SD. The shield electrode SH covers the side surfaces of the dielectric layers between the lowest dielectric layer 121 and the uppermost dielectric layer 131. The shield electrode SH may cover the side surfaces of the dielectric layers 121 and 131. The sections of the shield electrode SH located on the side surfaces SA to SD are shield electrodes SHA to SHD, respectively.

Figure 3:
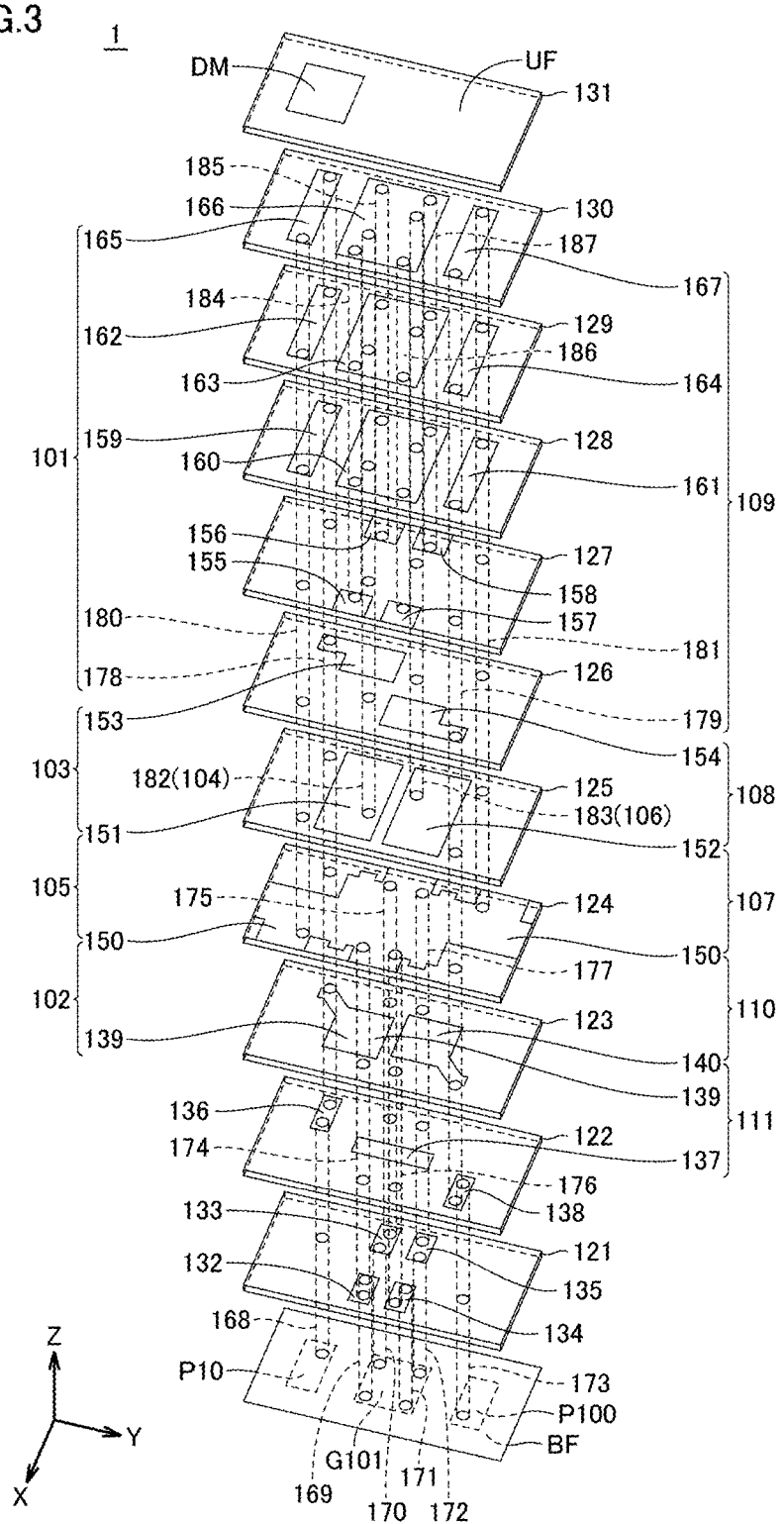
FIG. 3 is an exploded perspective view that shows an example multilayer structure of the multilayer band pass filter in FIG. 2.

FIG. 3 is an exploded perspective view that shows an example multilayer structure of the multilayer band pass filter 1 in FIG. 2. Line conductive patterns 132 to 135 are provided on the dielectric layer 121. The line conductive patterns 132 to 135 are electrically connected to the ground terminal G101 by via conductive patterns 169 to 172, respectively.

A line conductive pattern 136, a capacitor conductive pattern 137, and a line conductive pattern 138 are provided on the dielectric layer 122. The line conductive pattern 136 is electrically connected to the terminal P10 by a via conductive pattern 168. The line conductive pattern 138 is electrically connected to the terminal P100 by a via conductive pattern 173.

Capacitor conductive patterns 139 and 140 are provided on the dielectric layer 123. The capacitor conductive pattern 139 is electrically connected to the line conductive pattern 136 by a via conductive pattern 178. The capacitor conductive pattern 140 is electrically connected to the line conductive pattern 138 by a via conductive pattern 179. The capacitor conductive patterns 137, 139, and 140 define the capacitor 111.

A ground conductive pattern 150 is provided on the dielectric layer 124. The ground conductive pattern 150 is electrically connected to the shield electrodes SHA to SHD. The ground conductive pattern 150 is electrically connected to the line conductive patterns 132 to 135 by via conductive patterns 174 to 177, respectively. The capacitor conductive pattern 139 and the ground conductive pattern 150 define the capacitor 102. The capacitor conductive pattern 140 and the ground conductive pattern 150 define the capacitor 110.

Capacitor conductive patterns 151 and 152 are provided on the dielectric layer 125. The ground conductive pattern 150 and the capacitor conductive pattern 151 define the capacitor 105. The ground conductive pattern 150 and the capacitor conductive pattern 152 define the capacitor 107.

Capacitor conductive patterns 153 and 154 are provided on the dielectric layer 126. The capacitor conductive pattern 153 is electrically connected to the capacitor conductive pattern 139 by the via conductive pattern 178. The capacitor conductive pattern 154 is electrically connected to the capacitor conductive pattern 140 by the via conductive pattern 179. The capacitor conductive patterns 151 and 153 define the capacitor 103. The capacitor conductive patterns 152 and 154 define the capacitor 108.

Line conductive patterns 155 to 158 are provided on the dielectric layer 127. The line conductive patterns 155 and 157 are electrically connected to the shield electrode SHD. The line conductive patterns 156 and 158 are electrically connected to the shield electrode SHB.

A line conductive pattern 159, a ground conductive pattern 160, and a line conductive pattern 161 are provided on the dielectric layer 128. The line conductive patterns 159 and 161 extend in the X-axis direction.

The line conductive pattern 159 is electrically connected to the ground conductive pattern 150 by a via conductive pattern 180. The line conductive pattern 159 is electrically connected to the capacitor conductive pattern 153 by the via conductive pattern 178.

The ground conductive pattern 160 is electrically connected to the capacitor conductive pattern 151 by a via conductive pattern 182. The ground conductive pattern 160 is electrically connected to the capacitor conductive pattern 152 by a via conductive pattern 183. The ground conductive pattern 160 is electrically connected to the line conductive patterns 155 to 158 by via conductive patterns 184 to 187, respectively.

The line conductive pattern 161 is electrically connected to the capacitor conductive pattern 154 by the via conductive pattern 179. The line conductive pattern 161 is electrically connected to the ground conductive pattern 150 by a via conductive pattern 181.

A line conductive pattern 162, a ground conductive pattern 163, and a line conductive pattern 164 are provided on the dielectric layer 129. The line conductive pattern 162 is electrically connected to the line conductive pattern 159 by the via conductive patterns 178 and 180. The ground conductive pattern 163 is electrically connected to the ground conductive pattern 160 by the via conductive patterns 182 to 187. The line conductive pattern 164 is electrically connected to the line conductive pattern 161 by the via conductive patterns 179 and 181.

A line conductive pattern 165, a ground conductive pattern 166, and a line conductive pattern 167 are provided on the dielectric layer 130. The line conductive pattern 165 is electrically connected to the line conductive pattern 162 by the via conductive patterns 178 and 180. The ground conductive pattern 166 is electrically connected to the ground conductive pattern 163 by the via conductive patterns 182 to 187. The line conductive pattern 167 is electrically connected to the line conductive pattern 164 by the via conductive patterns 179 and 181.

The line conductive patterns 159, 162, and 165 and the via conductive patterns 178 and 180 define the inductor 101. The inductor 101 is a loop via inductor. The via conductive patterns 182 and 183 define the inductors 104 and 106, respectively. Each of the inductors 104 and 106 is a straight inductor includes a single via conductive pattern extending in the Z-axis direction. The line conductive patterns 161, 164, and 167 and the via conductive patterns 179 and 181 define the inductor 109. The inductor 109 is a loop via inductor.

Figure 4:
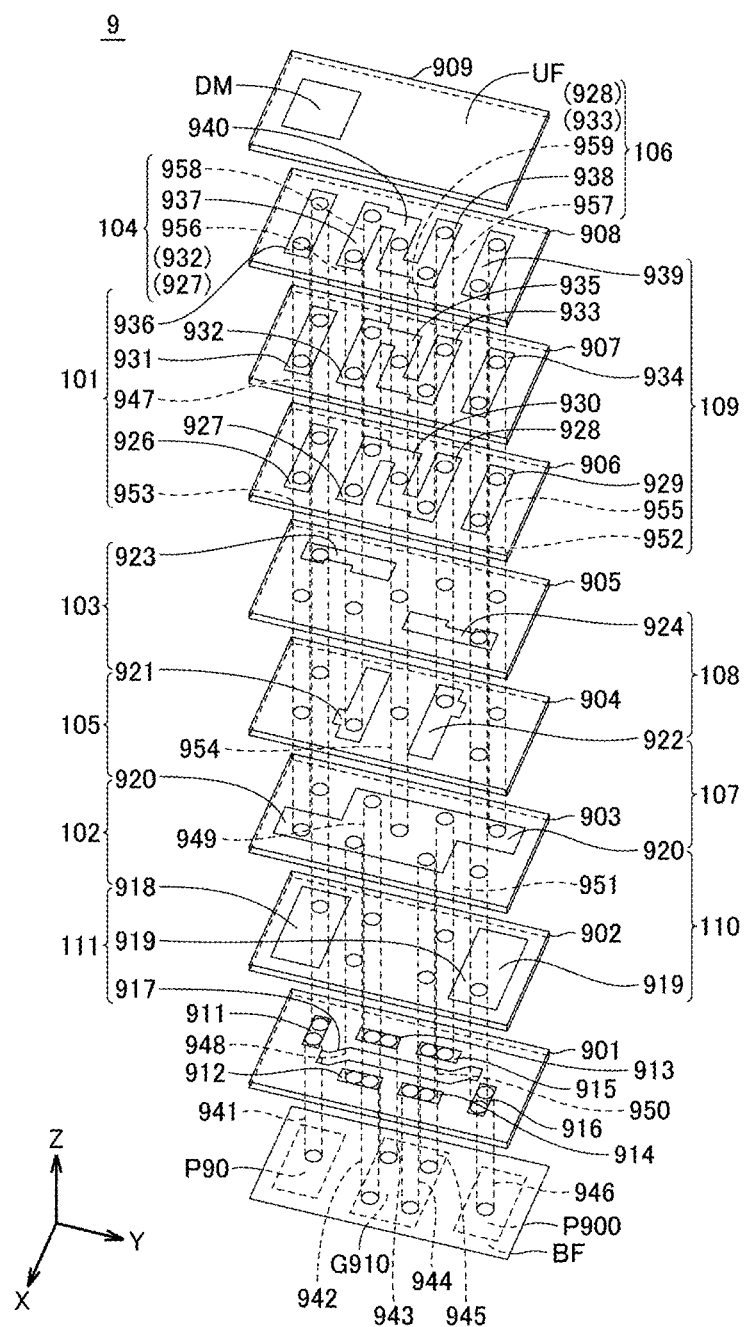
FIG. 4 is an exploded perspective view that shows an example multilayer structure of a multilayer band pass filter according to a comparative example.

FIG. 4 is an exploded perspective view that shows an example multilayer structure of the multilayer band pass filter 9 according to the comparative example. The equivalent circuit diagram of the multilayer band pass filter 9 is an equivalent circuit diagram in which the terminals P10 and P100 in the multilayer band pass filter 1 in the equivalent circuit diagram shown in FIG. 1 are replaced with terminals P90 and P900, respectively. As shown in FIG. 4, the multilayer band pass filter 9 is a multilayer body in which a plurality of dielectric layers 901 to 909 are laminated in the Z-axis direction.

The terminals P90 and P900 and a ground terminal G910 are located on the bottom surface BF. The ground terminal G910 defines the ground point GND. Examples of the terminals P90 and P900 and the ground terminal G910 may be land grid array (LGA) terminals in which planar electrodes are regularly positioned on the bottom surface BF.

Line conductive patterns 911 to 916 and a capacitor conductive pattern 917 are provided on the dielectric layer 901. The line conductive pattern 911 is electrically connected to the terminal P90 by a via conductive pattern 941. The line conductive patterns 912 to 915 are electrically connected to the ground terminal G910 by via conductive patterns 942 to 945, respectively. The line conductive pattern 916 is electrically connected to the terminal P900 by a via conductive pattern 946.

Capacitor conductive patterns 918 and 919 are provided on the dielectric layer 902. The capacitor conductive pattern 918 is electrically connected to the line conductive pattern 911 by a via conductive pattern 947. The capacitor conductive pattern 919 is electrically connected to the line conductive pattern 916 by a via conductive pattern 952. The capacitor conductive patterns 917, 918, and 919 define the capacitor 111.

A ground conductive pattern 920 is provided on the dielectric layer 903. The ground conductive pattern 920 is electrically connected to the line conductive patterns 912 to 915 by via conductive patterns 948 to 951, respectively. The capacitor conductive pattern 918 and the ground conductive pattern 920 define the capacitor 102. The capacitor conductive pattern 919 and the ground conductive pattern 920 define the capacitor 110.

Capacitor conductive patterns 921 and 922 are provided on the dielectric layer 904. The ground conductive pattern 920 and the capacitor conductive pattern 921 define the capacitor 105. The ground conductive pattern 920 and the capacitor conductive pattern 922 define the capacitor 107.

Capacitor conductive patterns 923 and 924 are provided on the dielectric layer 905. The capacitor conductive pattern 923 is electrically connected to the capacitor conductive pattern 918 by the via conductive pattern 947. The capacitor conductive pattern 924 is electrically connected to the capacitor conductive pattern 919 by the via conductive pattern 952. The capacitor conductive patterns 921 and 923 define the capacitor 103. The capacitor conductive patterns 922 and 924 define the capacitor 108.

Line conductive patterns 926 to 930 are provided on the dielectric layer 906. The line conductive patterns 926 to 929 extend in the X-axis direction. The line conductive pattern 930 electrically connects the line conductive patterns 927 and 928. The line conductive pattern 930 is electrically connected to the ground conductive pattern 920 by a via conductive pattern 954.

The line conductive pattern 926 is electrically connected to the ground conductive pattern 920 by a via conductive pattern 953. The line conductive pattern 926 is electrically connected to the capacitor conductive pattern 923 by the via conductive pattern 947.

The line conductive pattern 927 is electrically connected to the capacitor conductive pattern 921 by a via conductive pattern 956. The line conductive pattern 928 is electrically connected to the capacitor conductive pattern 922 by a via conductive pattern 957.

The line conductive pattern 929 is electrically connected to the capacitor conductive pattern 924 by the via conductive pattern 952. The line conductive pattern 929 is electrically connected to the ground conductive pattern 920 by a via conductive pattern 955.

Line conductive patterns 931 to 935 are provided on the dielectric layer 907. The line conductive patterns 931 to 934 extend in the X-axis direction. The line conductive pattern 935 electrically connects the line conductive patterns 932 and 933. The line conductive pattern 935 is electrically connected to the line conductive pattern 930 by the via conductive pattern 954.

The line conductive pattern 931 is electrically connected to the line conductive pattern 926 by the via conductive patterns 947 and 953. The line conductive pattern 932 is electrically connected to the line conductive pattern 927 by the via conductive pattern 956 and a via conductive pattern 958. The line conductive pattern 933 is electrically connected to the line conductive pattern 928 by the via conductive pattern 957 and a via conductive pattern 959. The line conductive pattern 934 is electrically connected to the line conductive pattern 929 by the via conductive patterns 952 and 955.

Line conductive patterns 936 to 940 are provided on the dielectric layer 908. The line conductive patterns 936 to 939 extend in the X-axis direction. The line conductive pattern 940 electrically connects the line conductive patterns 937 and 938. The line conductive pattern 940 is electrically connected to the line conductive pattern 935 by the via conductive pattern 954.

The line conductive pattern 936 is electrically connected to the line conductive pattern 931 by the via conductive patterns 947 and 953. The line conductive pattern 937 is electrically connected to the line conductive pattern 932 by the via conductive patterns 956 and 958. The line conductive pattern 938 is electrically connected to the line conductive pattern 933 by the via conductive patterns 957 and 959. The line conductive pattern 939 is electrically connected to the line conductive pattern 934 by the via conductive patterns 952 and 955.

The line conductive patterns 926, 931, and 936 and the via conductive patterns 947 and 953 define the inductor 101. The line conductive patterns 927, 932, and 937 and the via conductive patterns 956 and 958 define the inductor 104. The line conductive patterns 928, 933, and 938 and the via conductive patterns 957 and 959 define the inductor 106. The line conductive patterns 929, 934, and 939 and the via conductive patterns 952 and 955 define the inductor 109. The inductors 101, 104, 106, and 109 are loop via inductors.

As the size of the air-core portion surrounded by the line conductive pattern and the two via conductive patterns increases, the inductance of the loop via inductor increases. To efficiently utilize the limited design space, typically the line conductive pattern in the loop via inductor may be located in a position adjacent to or in a vicinity of the upper surface UF, and the via conductive patterns in the loop via inductor may be located in positions adjacent to or in a vicinity of the side surface.

If a conductor (e.g., shield electrode) is located on the upper surface or side surface of the multilayer band pass filter 9, unnecessary electromagnetic field coupling occurs between the loop via inductor and the conductor. Depending on the position where the multilayer band pass filter 9 is mounted, a conductor (e.g., housing) may be expected to be adjacent to or in a vicinity of to the upper surface UF or side surface. In that case, unnecessary electromagnetic field coupling also occurs between the loop via inductor and the conductor. Such unnecessary electromagnetic field coupling, which is not expected in design, may cause the frequency characteristics of the multilayer band pass filter 9 to deviate from predetermined frequency characteristics.

In the first preferred embodiment, some of the inductors included in the multilayer band pass filter are straight inductors, and the loop via inductors and the second inductors coexist. In the limited design space, predetermined inductance is able to be provided by the loop via inductors, which are able to form air-core portions, and the occurrence of unnecessary electromagnetic field coupling is able to be significantly reduced or prevented by the straight inductors, which are able to be located in positions remote from an outer portion of the multilayer body. With the multilayer band pass filter according to the first preferred embodiment, providing the inductance that defines the pass band and significantly reduces or prevents the unnecessary electromagnetic field coupling are able to be compatible with each other, and deviation in frequency characteristics of the multilayer band pass filter from desired frequency characteristics is able to be significantly reduced or prevented.

Figure 5:
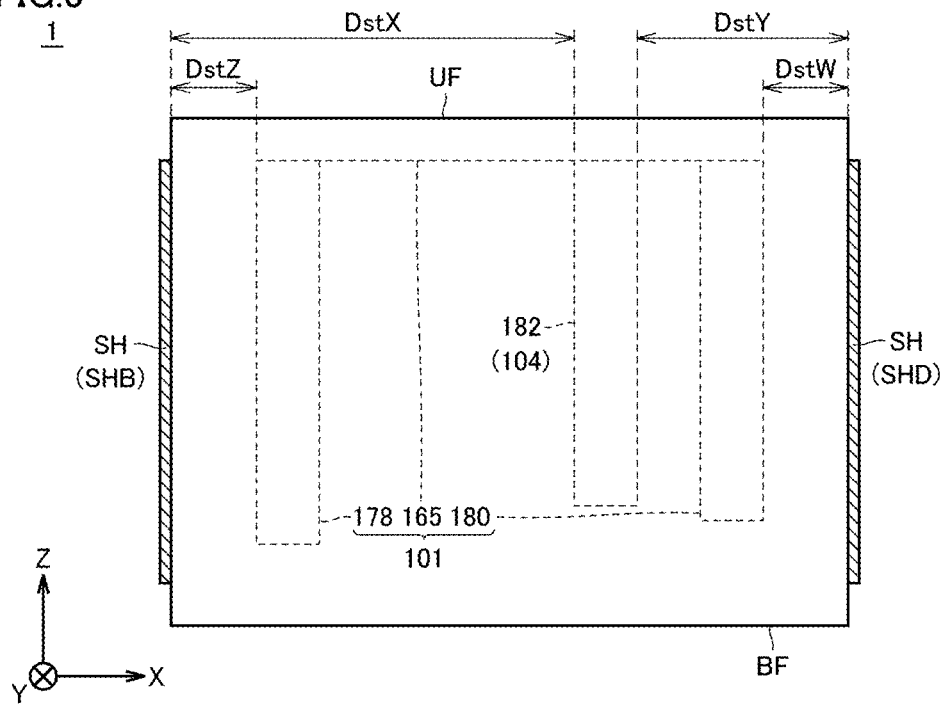
FIG. 5 shows the multilayer band pass filter in FIG. 2 as seen in plan view from a Y-axis direction.

FIG. 5 shows the multilayer band pass filter 1 in FIG. 2 as seen in plan view from the Y-axis direction. In FIG. 5, to improve the characteristics of the first preferred embodiment, among the conductive patterns provided inside the multilayer body, the conductive patterns 165, 178, and 180 included in the inductor 101, which is a loop via inductor, and the via conductive pattern 182 defining the inductor 104, which is a straight inductor, are shown, and the other conductive patterns are not shown.

As shown in FIG. 5, the via conductive pattern 182 is provided between the via conductive patterns 180 and 178. Thus, the distance DstX between the via conductive pattern 182 and the shield electrode SHB is longer than the distance DstZ between the via conductive pattern 178 and the shield electrode SHB. The distance DstY between the via conductive pattern 182 and the shield electrode SHD is longer than the distance DstW between the via conductive pattern 180 and the shield electrode SHD. That is, the inductor 104 is able to be located in a position more remote from the shield electrode SH than the inductor 101. Accordingly, electromagnetic field coupling occurring between the inductor 104 and the shield electrode SH is able to be further significantly reduced or prevented than electromagnetic field coupling occurring between the inductor 101 and the shield electrode SH.

Figure 6:
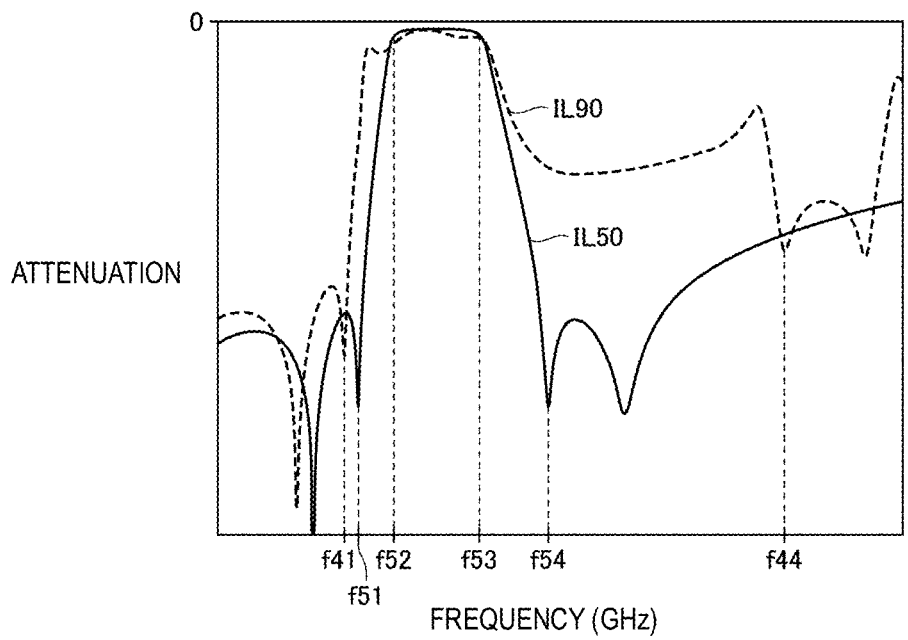
FIG. 6 shows both an insertion loss of the multilayer band pass filter according to the first preferred embodiment of the present invention and an insertion loss of the multilayer band pass filter according to the comparative example.

FIG. 6 shows both an insertion loss IL50 of the multilayer band pass filter 1 according to the first preferred embodiment and an insertion loss IL90 of the multilayer band pass filter 9 according to the comparative example. The insertion loss IL90 indicates an insertion loss when the multilayer band pass filter 9 is covered with a metal housing. The pass band of each of the multilayer band pass filters 1 and 9 is a frequency band of f52 to f53.

In FIG. 6, an attenuation (dB) in the vertical axis is a negative value. The insertion loss increases with an increase in the absolute value of the attenuation. The insertion loss is an index that indicates the proportion of signals transmitted to another terminal in an electronic component in signals input through a terminal in the electronic component. A larger insertion loss means a larger proportion of signals lost inside the electronic component in signals input into the electronic component.

As shown in FIG. 6, an attenuation pole for the insertion loss IL90 is present at the frequency f41, and a corresponding attenuation pole for the insertion loss IL50 is present at the frequency f51 (<f52), which is higher than the frequency f41. Therefore, the degree of change of the attenuation in the frequency band of f51 to f52 for the insertion loss IL50 is sharper than that for the insertion loss IL90. Another attenuation pole for the insertion loss IL90 is present at the frequency f44, and a corresponding attenuation pole for the insertion loss IL50 is present at the frequency f54 (>f53), which is lower than the frequency f44. Therefore, the degree of change of the attenuation in the frequency band of f53 to f54 for the insertion loss IL50 is sharper than that for the insertion loss IL90. Moreover, the insertion loss IL50 in the pass band of f52 to f53 is constant or substantially constant, and it is more flattened than that for the insertion loss IL90.

For the multilayer band pass filter 1, because the difference between the insertion loss in the pass band of f52 to f53 and the insertion loss in the range other than the pass band is large, the feature of restricting frequencies of signals that are able to pass to a certain frequency band in the multilayer band pass filter is significantly improved, in comparison with that in the multilayer band pass filter 9.

Referring again to FIG. 1, when a signal is input through the terminal P10, it is first transmitted to the LC parallel resonator 11 among the plurality of LC parallel resonators 11 to 14. When a signal is input through the terminal P100, it is first transmitted to the LC parallel resonator 14 among the plurality of LC parallel resonators 11 to 14. Thus, the impedance of each of the LC parallel resonators 11 and 14 has a dominant effect on formation of the pass band of the multilayer band pass filter 1. In the multilayer band pass filter 1, therefore, the inductor 101 included in the LC parallel resonator 11 and the inductor 104 included in the LC parallel resonator 14 are loop via inductors to provide the inductance that defines the pass band.

Figure 7:
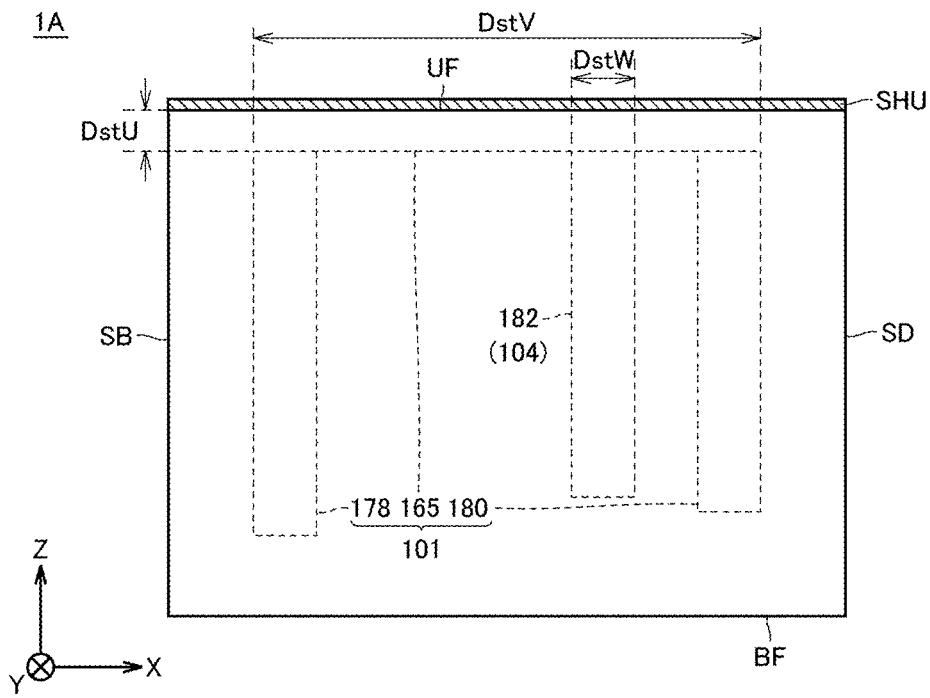
FIG. 7 shows a multilayer band pass filter according to a first variation of the first preferred embodiment of the present invention as seen in plan view from the Y-axis direction.

In the first preferred embodiment, the case where the shield electrodes are located on the side surfaces is described. The shield electrodes may be located on the upper surface of the multilayer body. FIG. 7 shows a multilayer band pass filter 1A according to a first variation of the first preferred embodiment as seen in plan view from the Y-axis direction. The first variation differs from the first preferred embodiment in that the shield electrodes are not provided on the shield electrodes SA to SD and a shield electrode SHU is located on the upper surface UF. The shield electrode SHU is electrically connected to the ground terminal G101 with the conductive patterns on the side surfaces SA to SD in the multilayer band pass filter 1A or the conductive patterns inside the multilayer body provided therebetween. The other features are the same or similar, and the description thereof is not repeated.

As shown in FIG. 7, the distance between the via conductive pattern 182 and the shield electrode SHU and the distance between the line conductive pattern 165 and the shield electrode SHU are both the distance DstU. In contrast, the width DstW of the portion of the via conductive pattern 182 opposed to the shield electrode SHU is shorter than the width DstV of the portion of the line conductive pattern 165 opposed to the shield electrode SHU. Thus, electromagnetic field coupling occurring between the inductor 104 and the shield electrode SHU is able to be further significantly reduced or prevented than electromagnetic field coupling occurring between the inductor 101 and the shield electrode SHU.

Figure 8:
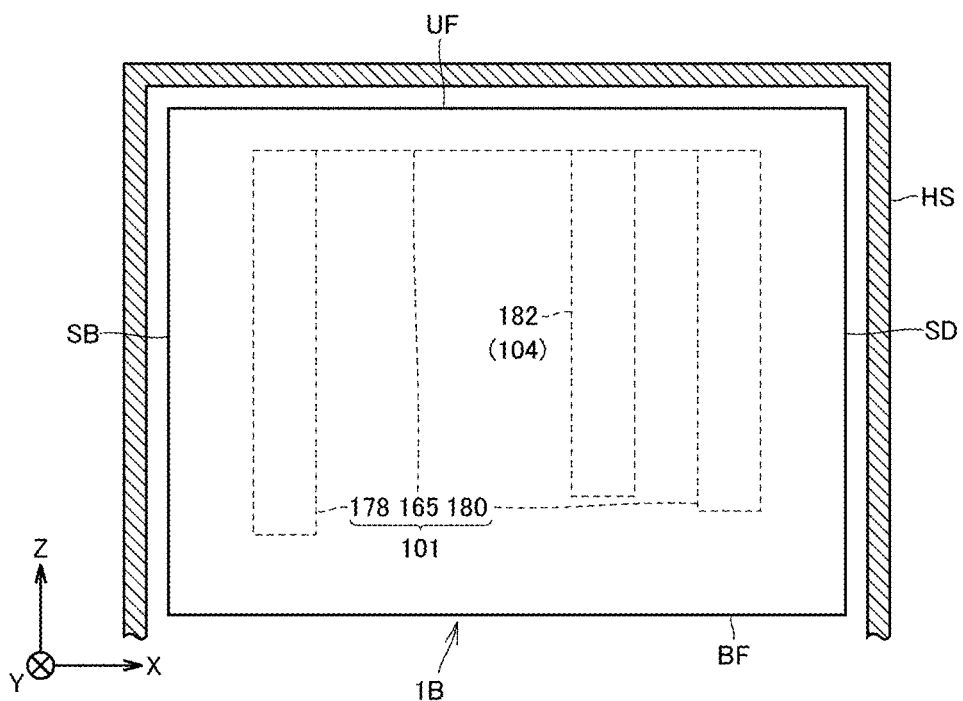
FIG. 8 shows a multilayer band pass filter according to a second variation of the first preferred embodiment of the present invention as seen in plan view from the Y-axis direction.

The shield electrode may be located on none of the side surfaces and the upper surface of the multilayer body. FIG. 8 shows a multilayer band pass filter 1B according to a second variation of the first preferred embodiment as seen in plan view from the Y-axis direction. FIG. 8 shows a state in which the multilayer band pass filter is covered with a housing HS. The second variation differs from the first preferred embodiment in that no shield electrodes are located on the side surfaces SA to SD. The other features are the same or similar, and the description thereof is not repeated.

As shown in FIG. 8, the inductor 104 is able to be located in a position more remote from the housing HS than the inductor 101. As seen in plan view from the Z-axis direction, the portion of the inductor 104 overlapping the housing HS is able to be smaller than the portion of the inductor 101 overlapping the housing HS. Accordingly, electromagnetic field coupling occurring between the inductor 104 and the housing HS is able to be further significantly reduced or prevented than electromagnetic field coupling occurring between the inductor 101 and the housing HS.

With the multilayer band pass filters according to the first preferred embodiment and the first and second variations, deviation in frequency characteristics from predetermined frequency characteristics is able to be significantly reduced or prevented.

In the first preferred embodiment, the multilayer band pass filter including the four LC parallel resonators is described. The number of LC parallel resonators included in a multilayer band pass filter according to a preferred embodiment may be three or less or may be five or more. In the following description, a multilayer band pass filter including five LC parallel resonators is described in a second preferred embodiment of the present invention, and a multilayer band pass filter including three LC parallel resonators is described in a third preferred embodiment of the present invention.

Second Preferred Embodiment

Figure 9:
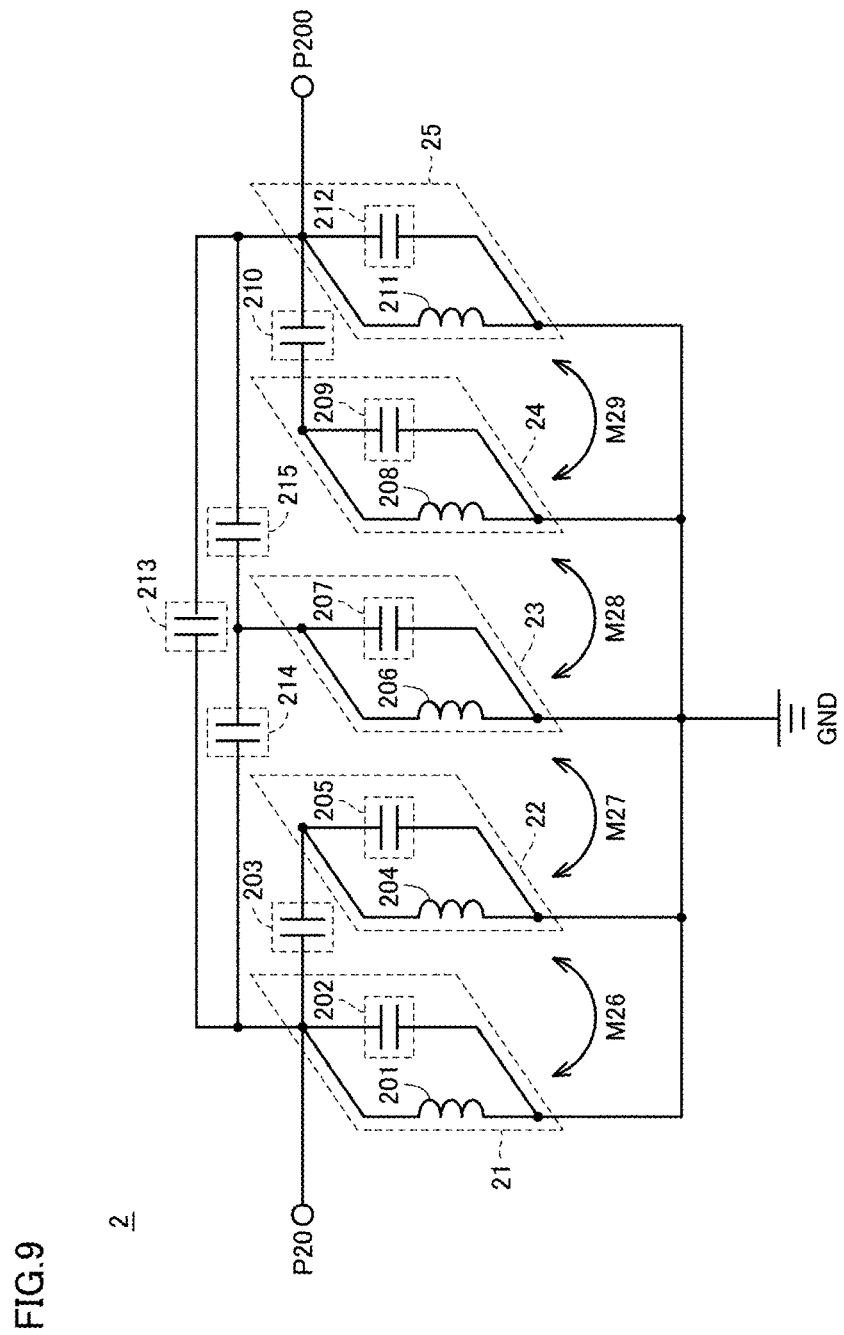
FIG. 9 is an equivalent circuit diagram of a multilayer band pass filter according to a second preferred embodiment of the present invention.

FIG. 9 is an equivalent circuit diagram of a multilayer band pass filter 2 according to the second preferred embodiment of the present invention. The multilayer band pass filter 2 includes terminals P20 and P200, LC parallel resonators 21 to 25, and capacitors 203, 210, and 213 to 215.

The LC parallel resonators 21 to 25 are provided in this order between the terminals P20 and P200. The LC parallel resonators 21 and 22 are next to each other. The LC parallel resonators 22 and 23 are next to each other. The LC parallel resonators 23 and 24 are next to each other. The LC parallel resonators 24 and 25 are next to each other.

Signals input through the terminal P20 are transmitted to the LC parallel resonators 21, 22, 23, 24, and 25 in this order and then are output through the terminal P200. Signals input through the terminal P200 are transmitted to the LC parallel resonators 25, 24, 23, 22, and 21 in this order and then are output through the terminal P20.

The LC parallel resonator 21 includes an inductor 201 and a capacitor 202. The LC parallel resonator 22 includes an inductor 204 and a capacitor 205. The LC parallel resonator 23 includes an inductor 206 and a capacitor 207. The LC parallel resonator 24 includes an inductor 208 and a capacitor 209. The LC parallel resonator 25 includes an inductor 211 and a capacitor 212.

A first terminal of the inductor 201 is electrically connected to the terminal P20. A second terminal of the inductor 201 is electrically connected to the ground point GND. The capacitor 203 is electrically connected between the first terminal of the inductor 201 and a first terminal of the inductor 204. A second terminal of the inductor 204 is electrically connected to the ground point GND. Magnetic coupling M26 occurs between the inductors 201 and 204.

The capacitor 214 is electrically connected between the first terminal of the inductor 201 and a first terminal of the inductor 206. A second terminal of the inductor 206 is electrically connected to the ground point GND. Magnetic coupling M27 occurs between the inductors 204 and 206.

The capacitor 215 is electrically connected between the first terminal of the inductor 206 and a first terminal of the inductor 211. The first terminal of the inductor 211 is electrically connected to the terminal P200. A second terminal of the inductor 211 is electrically connected to the ground point GND.

The capacitor 210 is electrically connected between a first terminal of the inductor 208 and the first terminal of the inductor 211. A second terminal of the inductor 208 is electrically connected to the ground point GND. Magnetic coupling M28 occurs between the inductors 206 and 208. Magnetic coupling M29 occurs between the inductors 208 and 211. The capacitor 213 is electrically connected between the first terminal of the inductor 201 and the first terminal of the inductor 211.

Figure 10:
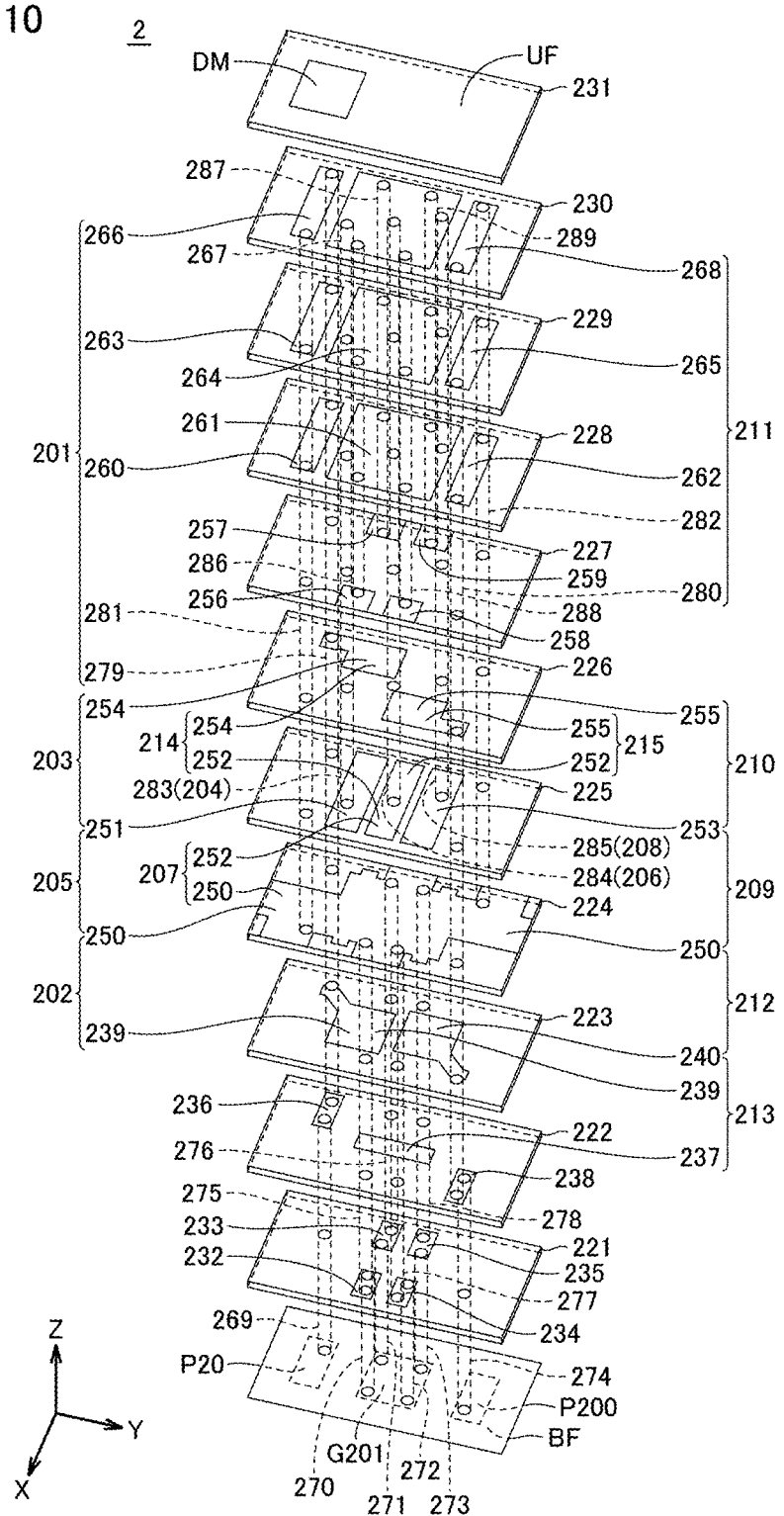
FIG. 10 is an exploded perspective view that shows an example multilayer structure of the multilayer band pass filter in FIG. 9.

FIG. 10 is an exploded perspective view that shows an example multilayer structure of the multilayer band pass filter 2 in FIG. 9. The external perspective view of the multilayer band pass filter 2 is the same or substantially the same as the external perspective view of the multilayer band pass filter 1 in FIG. 2. As shown in FIG. 10, the multilayer band pass filter 2 is a multilayer body in which a plurality of dielectric layers 221 to 231 are laminated in the Z-axis direction.

The terminals P20 and P200 and a ground terminal G201 are located on the bottom surface BF. The ground terminal G201 defines the ground point GND. Examples of the terminals P20 and P200 and the ground terminal G201 may be land grid array (LGA) terminals in which planar electrodes are regularly positioned on the bottom surface BF.

Line conductive patterns 232 to 235 are provided on the dielectric layer 221. The line conductive patterns 232 to 235 are electrically connected to the ground terminal G201 by via conductive patterns 270 to 273, respectively.

A line conductive pattern 236, a capacitor conductive pattern 237, and a line conductive pattern 238 are provided on the dielectric layer 222. The line conductive pattern 236 is electrically connected to the terminal P20 by a via conductive pattern 269. The line conductive pattern 238 is electrically connected to the terminal P200 by a via conductive pattern 274.

Capacitor conductive patterns 239 and 240 are provided on the dielectric layer 223. The capacitor conductive pattern 239 is electrically connected to the line conductive pattern 236 by a via conductive pattern 279. The capacitor conductive pattern 240 is electrically connected to the line conductive pattern 238 by a via conductive pattern 280. The capacitor conductive patterns 237, 239, and 240 define the capacitor 213.

A ground conductive pattern 250 is provided on the dielectric layer 224. The ground conductive pattern 250 is electrically connected to the shield electrodes SHA to SHD. The ground conductive pattern 250 is electrically connected to the line conductive patterns 232 to 235 by via conductive patterns 275 to 278, respectively. The capacitor conductive pattern 239 and the ground conductive pattern 250 define the capacitor 202. The capacitor conductive pattern 240 and the ground conductive pattern 250 define the capacitor 212.

Capacitor conductive patterns 251 to 253 are provided on the dielectric layer 225. The ground conductive pattern 250 and the capacitor conductive pattern 251 define the capacitor 205. The ground conductive pattern 250 and the capacitor conductive pattern 252 define the capacitor 207. The ground conductive pattern 250 and the capacitor conductive pattern 253 define the capacitor 209.

Capacitor conductive patterns 254 and 255 are provided on the dielectric layer 226. The capacitor conductive pattern 254 is electrically connected to the capacitor conductive pattern 239 by the via conductive pattern 279. The capacitor conductive pattern 255 is electrically connected to the capacitor conductive pattern 240 by the via conductive pattern 280. The capacitor conductive patterns 251 and 254 define the capacitor 203. The capacitor conductive patterns 252 and 254 define the capacitor 214. The capacitor conductive patterns 252 and 255 define the capacitor 215. The capacitor conductive patterns 253 and 255 define the capacitor 210.

Line conductive patterns 256 to 259 are provided on the dielectric layer 227. The line conductive patterns 256 and 258 are electrically connected to the shield electrode SHD. The line conductive patterns 257 and 259 are electrically connected to the shield electrode SHB.

A line conductive pattern 260, a ground conductive pattern 261, and a line conductive pattern 262 are provided on the dielectric layer 228. The line conductive patterns 260 and 262 extend in the X-axis direction.

The line conductive pattern 260 is electrically connected to the ground conductive pattern 250 by a via conductive pattern 281. The line conductive pattern 260 is electrically connected to the capacitor conductive pattern 254 by the via conductive pattern 279.

The ground conductive pattern 261 is electrically connected to the capacitor conductive pattern 251 by a via conductive pattern 283. The ground conductive pattern 261 is electrically connected to the capacitor conductive pattern 252 by a via conductive pattern 284. The ground conductive pattern 261 is electrically connected to the capacitor conductive pattern 253 by a via conductive pattern 285. The ground conductive pattern 261 is electrically connected to the line conductive patterns 256 to 259 by via conductive patterns 286 to 289, respectively.

The line conductive pattern 262 is electrically connected to the capacitor conductive pattern 255 by the via conductive pattern 280. The line conductive pattern 262 is electrically connected to the ground conductive pattern 250 by a via conductive pattern 282.

A line conductive pattern 263, a ground conductive pattern 264, and a line conductive pattern 265 are provided on the dielectric layer 229. The line conductive pattern 263 is electrically connected to the line conductive pattern 260 by the via conductive patterns 279 and 281. The ground conductive pattern 264 is electrically connected to the ground conductive pattern 261 by the via conductive patterns 283 to 289. The line conductive pattern 265 is electrically connected to the line conductive pattern 262 by the via conductive patterns 280 and 282.

A line conductive pattern 266, a ground conductive pattern 267, and a line conductive pattern 268 are provided on the dielectric layer 230. The line conductive pattern 266 is electrically connected to the line conductive pattern 263 by the via conductive patterns 279 and 281. The ground conductive pattern 267 is electrically connected to the ground conductive pattern 264 by the via conductive patterns 283 to 289. The line conductive pattern 268 is electrically connected to the line conductive pattern 265 by the via conductive patterns 280 and 282.

The line conductive patterns 260, 263, and 266 and the via conductive patterns 279 and 281 define the inductor 201. The inductor 201 is a loop via inductor. The via conductive patterns 283 to 285 define the inductors 204, 206, and 208, respectively. Each of the inductors 204, 206, and 208 is a straight inductor. The line conductive patterns 262, 265, and 268 and the via conductive patterns 280 and 282 define the inductor 211. The inductor 211 is a loop via inductor.

With the above-described multilayer band pass filter according to the second preferred embodiment, deviation in frequency characteristics from desired frequency characteristics is able to be significantly reduced or prevented.

Third Preferred Embodiment

Figure 11:
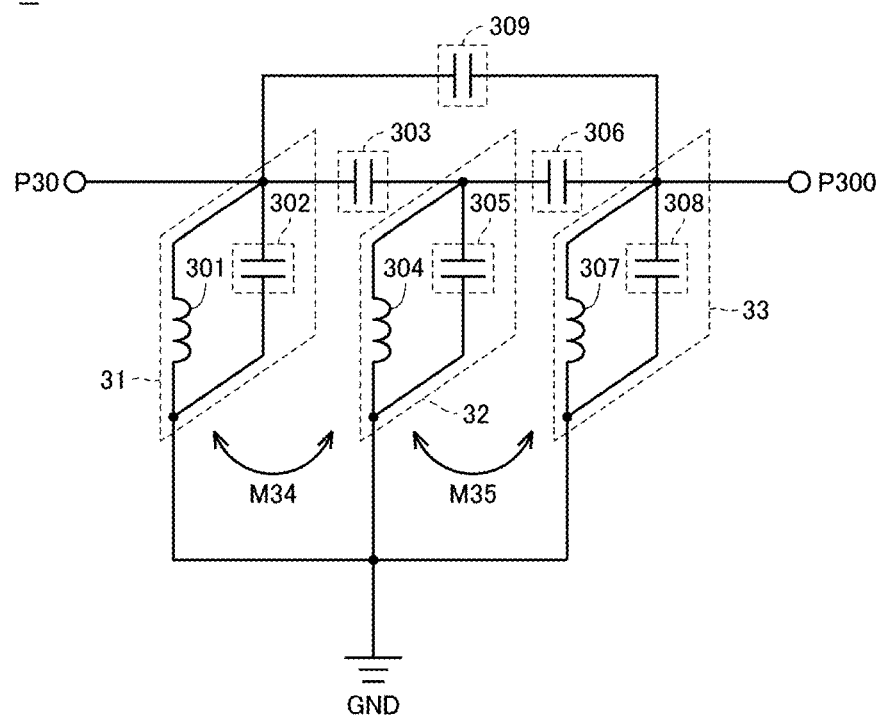
FIG. 11 is an equivalent circuit diagram of a multilayer band pass filter according to a third preferred embodiment of the present invention.

FIG. 11 is an equivalent circuit diagram of a multilayer band pass filter 3 according to the third preferred embodiment of the present invention. The multilayer band pass filter 3 includes terminals P30 and P300, LC parallel resonators 31 to 33, and capacitors 303, 306, and 309.

The LC parallel resonators 31 to 33 are provided in this order between the terminals P30 and P300. The LC parallel resonators 31 and 32 are next to each other. The LC parallel resonators 32 and 33 are next to each other.

Signals input through the terminal P30 are transmitted to the LC parallel resonators 31, 32, and 33 in this order and then are output through the terminal P300. Signals input through the terminal P300 are transmitted to the LC parallel resonators 33, 32, and 31 in this order and then are output through the terminal P30.

The LC parallel resonator 31 includes an inductor 301 and a capacitor 302. The LC parallel resonator 32 includes an inductor 304 and a capacitor 305. The LC parallel resonator 33 includes an inductor 307 and a capacitor 308.

A first terminal of the inductor 301 is electrically connected to the terminal P30. A second terminal of the inductor 301 is electrically connected to the ground point GND. The capacitor 303 is electrically connected between the first terminal of the inductor 301 and a first terminal of the inductor 304. A second terminal of the inductor 304 is electrically connected to the ground point GND. Magnetic coupling M34 occurs between the inductors 301 and 304.

The capacitor 306 is electrically connected between the first terminal of the inductor 304 and a first terminal of the inductor 307. The first terminal of the inductor 307 is electrically connected to the terminal P300. A second terminal of the inductor 307 is electrically connected to the ground point GND. Magnetic coupling M35 occurs between the inductors 304 and 307. A first terminal of the capacitor 309 is electrically connected between the first terminal of the inductor 301 and the first terminal of the inductor 307.

Figure 12:
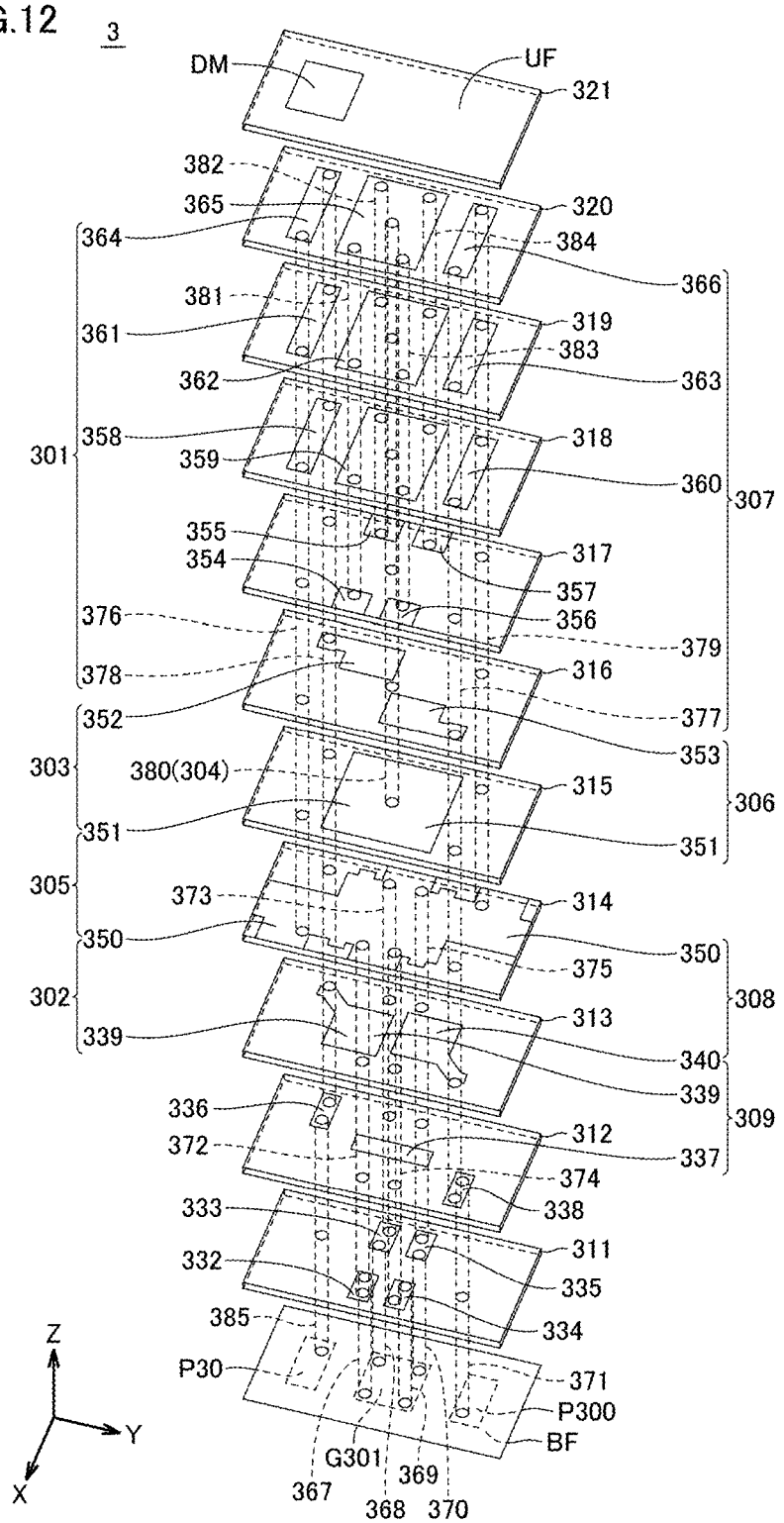
FIG. 12 is an exploded perspective view that shows an example multilayer structure of the multilayer band pass filter in FIG. 11.

FIG. 12 is an exploded perspective view that shows an example multilayer structure of the multilayer band pass filter 3 in FIG. 11. The external perspective view of the multilayer band pass filter 3 is substantially the same as the external perspective view of the multilayer band pass filter 1 in FIG. 2. As shown in FIG. 12, the multilayer band pass filter 3 is a multilayer body in which a plurality of dielectric layers 311 to 321 are laminated in the Z-axis direction.

The terminals P30 and P300 and a ground terminal G301 are located on the bottom surface BF. The ground terminal G301 defines the ground point GND. Examples of the terminals P30 and P300 and the ground terminal G301 may be land grid array (LGA) terminals in which planar electrodes are regularly positioned on the bottom surface BF.

Line conductive patterns 332 to 335 are provided on the dielectric layer 311. The line conductive patterns 332 to 335 are electrically connected to the ground terminal G301 by via conductive patterns 367 to 370, respectively.

A line conductive pattern 336, a capacitor conductive pattern 337, and a line conductive pattern 338 are provided on the dielectric layer 312. The line conductive pattern 336 is electrically connected to the terminal P30 by a via conductive pattern 385. The line conductive pattern 338 is electrically connected to the terminal P300 by a via conductive pattern 371.

Capacitor conductive patterns 339 and 340 are provided on the dielectric layer 313. The capacitor conductive pattern 339 is electrically connected to the line conductive pattern 336 by a via conductive pattern 378. The capacitor conductive pattern 340 is electrically connected to the line conductive pattern 338 by a via conductive pattern 377. The capacitor conductive patterns 337, 339, and 340 define the capacitor 309.

A ground conductive pattern 350 is provided on the dielectric layer 314. The ground conductive pattern 350 is electrically connected to the shield electrodes SHA to SHD. The ground conductive pattern 350 is electrically connected to the line conductive patterns 332 to 335 by via conductive patterns 372 to 375, respectively.

The ground conductive pattern 350 and the capacitor conductive pattern 339 define the capacitor 302. The ground conductive pattern 350 and the capacitor conductive pattern 340 define the capacitor 308.

A capacitor conductive pattern 351 is provided on the dielectric layer 315. The capacitor conductive pattern 351 and the ground conductive pattern 350 define the capacitor 305.

Capacitor conductive patterns 352 and 353 are provided on the dielectric layer 316. The capacitor conductive patterns 351 and 352 define the capacitor 303. The capacitor conductive patterns 351 and 353 define the capacitor 306.

Line conductive patterns 354 to 357 are provided on the dielectric layer 317. The line conductive patterns 354 and 356 are electrically connected to the shield electrode SHD. Each of the line conductive patterns 355 and 357 is electrically connected to the shield electrode SHB.

A line conductive pattern 358, a ground conductive pattern 359, and a line conductive pattern 360 are provided on the dielectric layer 318. The line conductive patterns 358 and 360 extend in the X-axis direction.

The line conductive pattern 358 is electrically connected to the ground conductive pattern 350 by a via conductive pattern 376. The line conductive pattern 358 is electrically connected to the capacitor conductive pattern 339 by the via conductive pattern 378.

The ground conductive pattern 359 is electrically connected to the capacitor conductive pattern 351 by a via conductive pattern 380. The ground conductive pattern 359 is electrically connected to the line conductive patterns 354 to 357 by via conductive patterns 381 to 384, respectively.

The line conductive pattern 360 is electrically connected to the capacitor conductive pattern 340 by the via conductive pattern 377. The line conductive pattern 360 is electrically connected to the ground conductive pattern 350 by a via conductive pattern 379.

A line conductive pattern 361, a ground conductive pattern 362, and a line conductive pattern 363 are provided on the dielectric layer 319. The line conductive patterns 361 and 363 extend in the X-axis direction.

The line conductive pattern 361 is electrically connected to the line conductive pattern 358 by the via conductive patterns 376 and 378. The ground conductive pattern 362 is electrically connected to the ground conductive pattern 359 by the via conductive patterns 380 to 384. The line conductive pattern 363 is electrically connected to the line conductive pattern 360 by the via conductive patterns 377 and 379.

A line conductive pattern 364, a ground conductive pattern 365, and a line conductive pattern 366 are provided on the dielectric layer 320. The line conductive patterns 364 and 366 extend in the X-axis direction.

The line conductive pattern 364 is electrically connected to the line conductive pattern 361 by the via conductive patterns 376 and 378. The ground conductive pattern 365 is electrically connected to the ground conductive pattern 362 by the via conductive patterns 380 to 384. The line conductive pattern 366 is electrically connected to the line conductive pattern 363 by the via conductive patterns 377 and 379.

The line conductive patterns 358, 361, and 364 and the via conductive patterns 376 and 378 define the inductor 301. The inductor 301 is a loop via inductor. The via conductive pattern 380 defines the inductor 304. The inductor 304 is a straight inductor. The line conductive patterns 360, 363, and 366 and the via conductive patterns 377 and 379 define the inductor 307. The inductor 307 is a loop via inductor.

With the above-described multilayer band pass filter according to the third preferred embodiment, deviation in frequency characteristics from desired frequency characteristics is able to be significantly reduced or prevented.

Fourth Preferred Embodiment

In the first to third preferred embodiments, the cases where the multilayer band pass filter includes the LC parallel resonator including the single straight inductor are described. A multilayer band pass filter according to a preferred embodiment may include an LC parallel resonator including a plurality of straight inductors. In a fourth preferred embodiment of the present invention, a case where a multilayer band pass filter includes an LC parallel resonator including two straight inductors is described.

Figure 13:
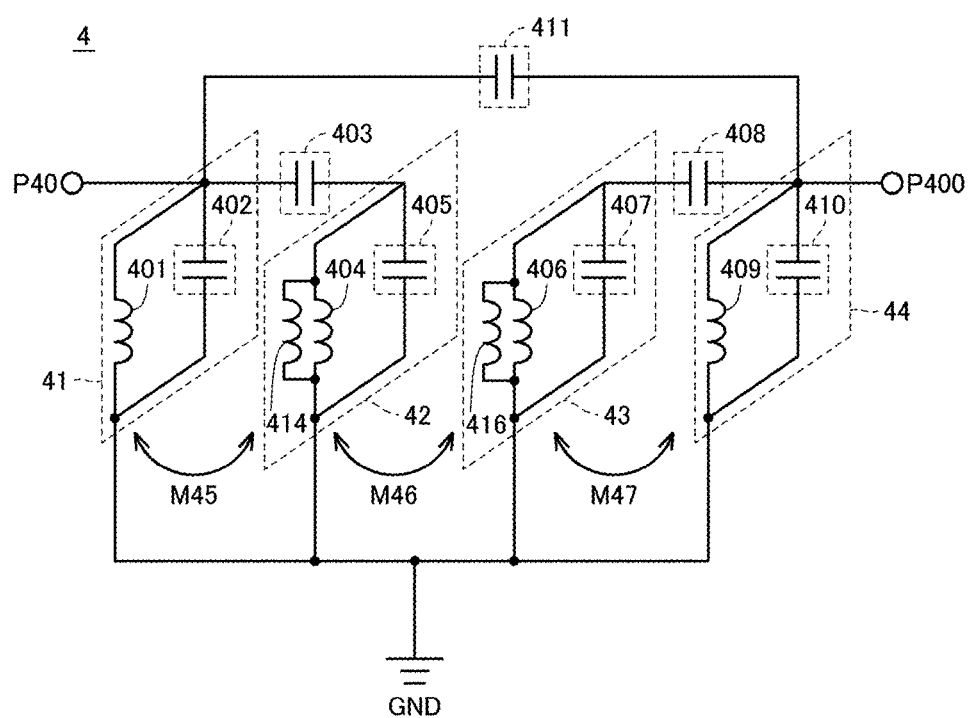
FIG. 13 is an equivalent circuit diagram of a multilayer band pass filter according to a fourth preferred embodiment of the present invention.

FIG. 13 is an equivalent circuit diagram of a multilayer band pass filter 4 according to the fourth preferred embodiment. As shown in FIG. 13, the multilayer band pass filter 4 includes terminals P40 and P400, LC parallel resonators 41 to 44, and capacitors 403, 408, and 411.

The LC parallel resonators 41 to 44 are provided in this order between the terminals P40 and P400. The LC parallel resonators 41 and 42 are next to each other. The LC parallel resonators 42 and 43 are next to each other. The LC parallel resonators 43 and 44 are next to each other.

Signals input through the terminal P40 are transmitted to the LC parallel resonators 41, 42, 43, and 44 in this order and then are output through the terminal P400. Signals input through the terminal P400 are transmitted to the LC parallel resonators 44, 43, 42, and 41 in this order and then are output through the terminal P40.

The LC parallel resonator 41 includes an inductor 401 and a capacitor 402. The LC parallel resonator 42 includes inductors 404 and 414 and a capacitor 405. The inductors 404 and 414 are electrically connected in parallel between a first electrode and a second electrode of the capacitor 405. The inductors 404 and 414 have the same or substantially the same potential.

The LC parallel resonator 43 includes inductors 406 and 416 and a capacitor 407. The inductors 406 and 416 are electrically connected in parallel between a first electrode and a second electrode of the capacitor 407. The inductors 406 and 416 have the same or substantially the same potential. The LC parallel resonator 44 includes an inductor 409 and a capacitor 410.

A first terminal of the inductor 401 is electrically connected to the terminal P40. A second terminal of the inductor 401 is electrically connected to the ground point GND. The capacitor 403 is electrically connected between the first terminal of the inductor 401 and a first terminal of the inductor 404. A second terminal of the inductor 404 is electrically connected to the ground point GND. Magnetic coupling M45 occurs between the inductors 401, 404, and 414.

The capacitor 408 is electrically connected between a first terminal of the inductor 406 and a first terminal of the inductor 409. The first terminal of the inductor 409 is electrically connected to the terminal P400. Each of a second terminal of the inductor 406 and a second terminal of the inductor 409 is electrically connected to the ground point GND. Magnetic coupling M46 occurs between the inductors 404, 414, 406, and 416. Magnetic coupling M47 occurs between the inductors 406, 416, and 409. The capacitor 411 is electrically connected between the first terminal of the inductor 401 and the first terminal of the inductor 409.

Figure 14:
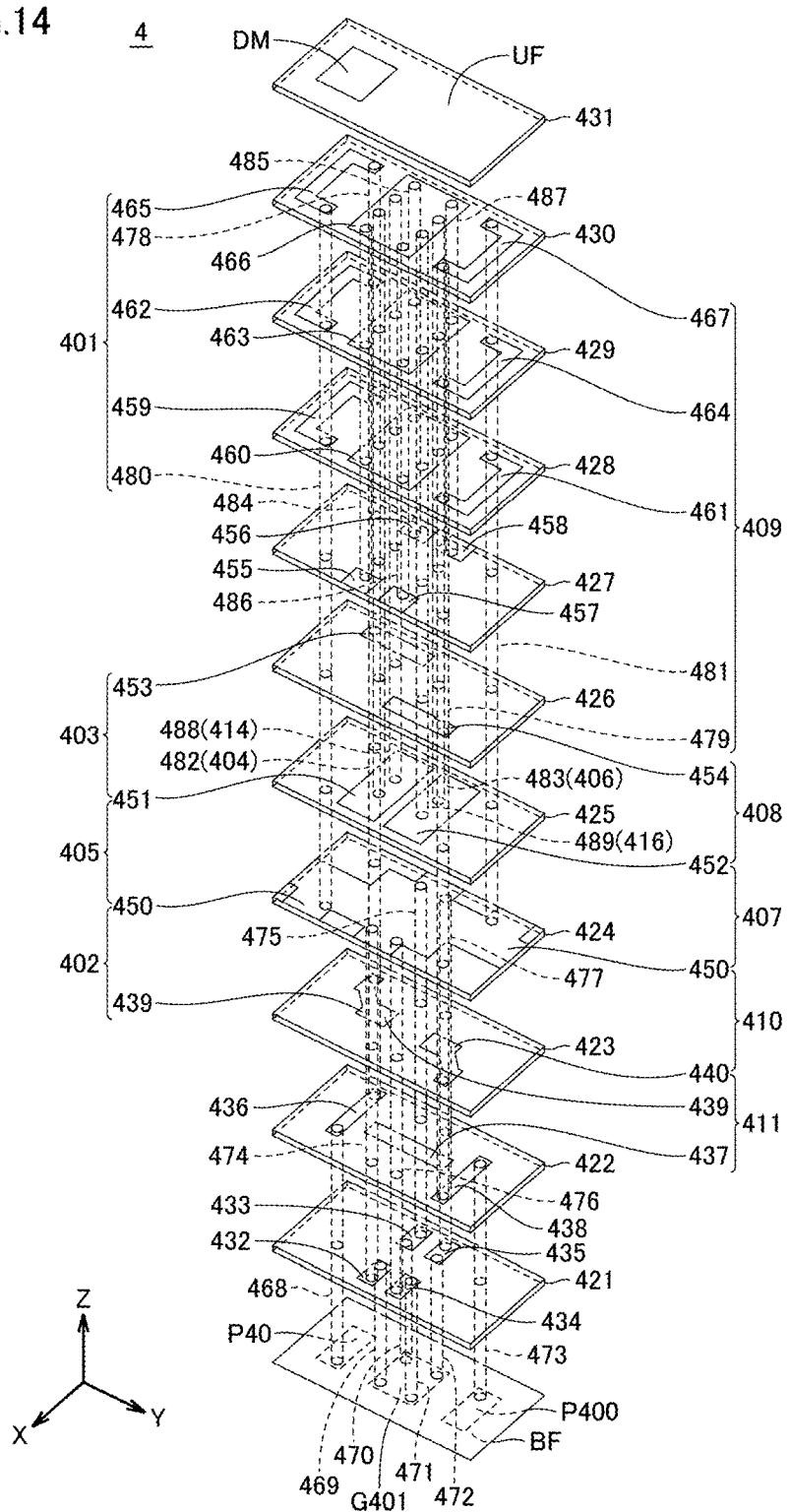
FIG. 14 is an exploded perspective view that shows an example multilayer structure of the multilayer band pass filter in FIG. 13.

FIG. 14 is an exploded perspective view that shows an example multilayer structure of the multilayer band pass filter 4 in FIG. 13. The external perspective view of the multilayer band pass filter 4 is substantially the same as the external perspective view of the multilayer band pass filter 1 in FIG. 2. As shown in FIG. 14, the multilayer band pass filter 4 is a multilayer body in which a plurality of dielectric layers 421 to 431 are laminated in the Z-axis direction.

The terminals P40 and P400 and a ground terminal G401 are located on the bottom surface BF. The ground terminal G401 defines the ground point GND. Examples of the terminals P40 and P400 and the ground terminal G401 may be land grid array (LGA) terminals in which planar electrodes are regularly positioned on the bottom surface BF.

Line conductive patterns 432 to 435 are provided on the dielectric layer 421. The line conductive patterns 432 to 435 are electrically connected to the ground terminal G401 by via conductive patterns 469 to 472, respectively.

A line conductive pattern 436, a capacitor conductive pattern 437, and a line conductive pattern 438 are provided on the dielectric layer 422. The line conductive pattern 436 is electrically connected to the terminal P40 by a via conductive pattern 468. The line conductive pattern 438 is electrically connected to the terminal P400 by a via conductive pattern 473.

Capacitor conductive patterns 439 and 440 are provided on the dielectric layer 423. The capacitor conductive pattern 439 is electrically connected to the line conductive pattern 436 by a via conductive pattern 478. The capacitor conductive pattern 440 is electrically connected to the line conductive pattern 438 by a via conductive pattern 479. The capacitor conductive patterns 437, 439, and 440 define the capacitor 411.

A ground conductive pattern 450 is provided on the dielectric layer 424. The ground conductive pattern 450 is electrically connected to the shield electrodes SHA to SHD. The ground conductive pattern 450 is electrically connected to the line conductive patterns 432 to 435 by via conductive patterns 474 to 477, respectively. The capacitor conductive pattern 439 and the ground conductive pattern 450 define the capacitor 402. The capacitor conductive pattern 440 and the ground conductive pattern 450 define the capacitor 410.

Capacitor conductive patterns 451 and 452 are provided on the dielectric layer 425. The ground conductive pattern 450 and the capacitor conductive pattern 451 define the capacitor 405. The ground conductive pattern 450 and the capacitor conductive pattern 452 define the capacitor 407.

Capacitor conductive patterns 453 and 454 are provided on the dielectric layer 426. The capacitor conductive pattern 453 is electrically connected to the capacitor conductive pattern 439 by the via conductive pattern 478. The capacitor conductive pattern 454 is electrically connected to the capacitor conductive pattern 440 by the via conductive pattern 479. The capacitor conductive patterns 451 and 453 define the capacitor 403. The capacitor conductive patterns 452 and 454 define the capacitor 408.

Line conductive patterns 455 to 458 are provided on the dielectric layer 427. The line conductive patterns 455 and 457 are electrically connected to the shield electrode SHD. The line conductive patterns 456 and 458 are electrically connected to the shield electrode SHB.

A line conductive pattern 459, a ground conductive pattern 460, and a line conductive pattern 461 are provided on the dielectric layer 428. Each of the line conductive patterns 459 and 461 has a portion extending in the X-axis direction.

The line conductive pattern 459 is electrically connected to the ground conductive pattern 450 by a via conductive pattern 480. The line conductive pattern 459 is electrically connected to the capacitor conductive pattern 453 by the via conductive pattern 478.

The ground conductive pattern 460 is electrically connected to the capacitor conductive pattern 451 by via conductive patterns 482 and 488. The ground conductive pattern 460 is electrically connected to the capacitor conductive pattern 452 by via conductive patterns 483 and 489. The ground conductive pattern 460 is electrically connected to the line conductive patterns 455 to 458 by via conductive patterns 484 to 487, respectively.

The line conductive pattern 461 is electrically connected to the capacitor conductive pattern 454 by the via conductive pattern 479. The line conductive pattern 461 is electrically connected to the ground conductive pattern 450 by a via conductive pattern 481.

A line conductive pattern 462, a ground conductive pattern 463, and a line conductive pattern 464 are provided on the dielectric layer 429. The line conductive pattern 462 is electrically connected to the line conductive pattern 459 by the via conductive patterns 478 and 480. The ground conductive pattern 463 is electrically connected to the ground conductive pattern 460 by the via conductive patterns 482 to 489. The line conductive pattern 464 is electrically connected to the line conductive pattern 461 by the via conductive patterns 479 and 481.

A line conductive pattern 465, a ground conductive pattern 466, and a line conductive pattern 467 are provided on the dielectric layer 430. The line conductive pattern 465 is electrically connected to the line conductive pattern 462 by the via conductive patterns 478 and 480. The ground conductive pattern 466 is electrically connected to the ground conductive pattern 463 by the via conductive patterns 482 to 489. The line conductive pattern 467 is electrically connected to the line conductive pattern 464 by the via conductive patterns 479 and 481.

The line conductive patterns 459, 462, and 465 and the via conductive patterns 478 and 480 define the inductor 401. The inductor 401 is a loop via inductor. The via conductive patterns 482, 488, 483, and 489 define the inductors 404, 414, 406, and 416, respectively. Each of the inductors 404, 414, 406, and 416 is a straight inductor includes a single via conductive pattern extending in the Z-axis direction. The line conductive patterns 461, 464, and 467 and the via conductive patterns 479 and 481 define the inductor 409. The inductor 409 is a loop via inductor.

Because the number of straight inductors is increased and thus a current is distributed to the plurality of straight inductors, the insertion loss of the multilayer band pass filter is significantly improved. Any number of straight inductors may be selected depending on the size and desired characteristics of the multilayer band pass filter.

With the multilayer band pass filter according to the fourth preferred embodiment, deviation in frequency characteristics from desired frequency characteristics is able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer band pass filter including a multilayer body in which a plurality of dielectric layers including first and second dielectric layers are laminated in a lamination direction, the multilayer band pass filter comprising:
   a first LC parallel resonator including a first inductor; and
   a second LC parallel resonator including a second inductor; wherein
   the first inductor includes a first line conductive pattern extending in a first direction on the first dielectric layer and first and second via conductive patterns extending from the first line conductive pattern toward the second dielectric layer; and
   the second inductor includes only a third via conductive pattern extending in the lamination direction.

2. The multilayer band pass filter according to claim 1, wherein, as seen from a second direction perpendicular or substantially perpendicular to the first direction with respect to the first dielectric layer, the third via conductive pattern is provided between the first and second via conductive patterns.

3. The multilayer band pass filter according to claim 1, wherein
   the second LC parallel resonator further includes a fourth inductor electrically connected in parallel with the second inductor; and
   the fourth inductor includes a sixth via conductive pattern extending in the lamination direction.

4. The multilayer band pass filter according to claim 1, further comprising a shield electrode located on an outer portion of the multilayer body.

5. The multilayer band pass filter according to claim 4, wherein the shield electrode covers at least partially a side surface extending along the lamination direction of the multilayer body.

6. The multilayer band pass filter according to claim 4, wherein the shield electrode is electrically connected to ground.

7. The multilayer band pass filter according to claim 4, wherein at least one line conductive pattern provided on at least one dielectric layer of the multilayer body is electrically connected to the shield electrode.

8. The multilayer band pass filter according to claim 4, further comprising:

a third LC parallel resonator including a third inductor; and a fourth LC parallel resonator including a fourth inductor; wherein a distance between the first inductor and the shield electrode is shorter than a distance between the fourth inductor and the shield electrode.

9. The multilayer band pass filter according to claim 1, further comprising:

a first terminal;

a second terminal; and a third LC parallel resonator including a third inductor; wherein a signal input through the first terminal is transmitted to the first LC parallel resonator, the second LC parallel resonator, and the third LC parallel resonator in this order and then is output through the second terminal; and the third inductor includes a second line conductive pattern extending in the first direction on the first dielectric layer and fourth and fifth via conductive patterns extending from the second line conductive pattern toward the second dielectric layer.

10. The multilayer band pass filter according to claim 9, further comprising:

a fourth LC parallel resonator including a fourth inductor; wherein the first LC parallel resonator, the second LC parallel resonator, the third LC parallel resonator, and the fourth LC parallel resonator are provided in this order between the first terminal and the second terminal.

11. The multilayer band pass filter according to claim 1, wherein a capacitor is electrically connected between a first terminal of the first inductor and a first terminal of the second inductor.

12. The multilayer band pass filter according to claim 11, wherein a second terminal of the first inductor is electrically connected to ground; and a second terminal of the second inductor is electrically connected to ground.

13. The multilayer band pass filter according to claim 1, further comprising a shield electrode located on only a single outer surface of the multilayer body.

14. A multilayer band pass filter including a multilayer body in which a plurality of dielectric layers including first and second dielectric layers are laminated in a lamination direction, the multilayer band pass filter comprising:

a first LC parallel resonator including a first inductor; and a second LC parallel resonator including a second inductor and a fourth inductor electrically connected in parallel with the second inductor; wherein the first inductor includes a first line conductive pattern extending in a first direction on the first dielectric layer and first and second via conductive patterns extending from the first line conductive pattern toward the second dielectric layer;

the second inductor includes a third via conductive pattern extending in the lamination direction; and the fourth inductor includes a sixth via conductive pattern extending in the lamination direction.

15. A multilayer band pass filter including a multilayer body in which a plurality of dielectric layers including first and second dielectric layers are laminated in a lamination direction, the multilayer band pass filter comprising:

a first LC parallel resonator including a first inductor;

a second LC parallel resonator including a second inductor;

a third LC parallel resonator including a third inductor;

a fourth LC parallel resonator including a fourth inductor; and a shield electrode located on an outer portion of the multilayer body; wherein the first inductor includes a first line conductive pattern extending in a first direction on the first dielectric layer and first and second via conductive patterns extending from the first line conductive pattern toward the second dielectric layer;

the second inductor includes a third via conductive pattern extending in the lamination direction; and a distance between the first inductor and the shield electrode is shorter than a distance between the fourth inductor and the shield electrode.

* * * * *